(12) United States Patent
Chiu et al.

(10) Patent No.: US 7,713,802 B2
(45) Date of Patent: May 11, 2010

(54) METHOD OF SULFURATION TREATMENT FOR A STRAINED INALAS/INGAAS METAMORPHIC HIGH ELECTRON MOBILITY TRANSISTOR

(75) Inventors: Hsien-Chin Chiu, Taipei (TW); Liann-Be Chang, Taoyuan County (TW); Yuan-Chang Huang, Taichung (TW); Chung-Wen Chen, Taipei County (TW); Wei-Hsien Lee, Taipei County (TW)

(73) Assignee: Chang Gung University, Tao-Yuan (TW)

(*) Notice: Subject to any disclaimer, the term of this patent is extended or adjusted under 35 U.S.C. 154(b) by 403 days.

(21) Appl. No.: 11/716,826

(22) Filed: Mar. 12, 2007

(65) Prior Publication Data

US 2008/0227246 A1 Sep. 18, 2008

(51) Int. Cl.
*H01L 21/338* (2006.01)
(52) U.S. Cl. .................. 438/172; 257/E21.407
(58) Field of Classification Search .......... 438/172; 257/E21.407
See application file for complete search history.

(56) References Cited

U.S. PATENT DOCUMENTS 5,407,869 A * 4/1995 Holloway et al. .......... 438/694

OTHER PUBLICATIONS

Eisenbeiser et al. "Metamorphic InAlAs/InGaAs Enhancement Mode HEMT's on GaAs Substrates", IEEE Electron Device Letters, vol. 20, No. 10,(1999) pp. 507-509.*
Habibi et al., "Improvement in Schottky didode characteristics of metal-In0.52Al0.48As contact using an in situ photochemical etching and surface passivation process", Indium Phosphide and Related Materials, 1995. Conference Proceedings, Seventh International Conference on May 9-13, 1995 pp. 821-824.*

* cited by examiner

*Primary Examiner*—W. David Coleman
*Assistant Examiner*—Sonya D McCall-Shepard
(74) *Attorney, Agent, or Firm*—C. G. Mersereau; Nikolai & Mersereau, P.A.

(57) ABSTRACT

This invention relates to a method of sulfuration treatment for InAlAs/InGaAs metamorphic high electron mobility transistor (MHEMT), and the sulfuration treatment is applied to the InAlAs/InGaAs MHEMT for a passivation treatment for Gate, in order to increase initial voltage, lower the surface states and decrease surface leakage current, which makes the MHEMT work in a range of high current density and high input power.

6 Claims, 6 Drawing Sheets

METHOD OF SULFURATION TREATMENT FOR A STRAINED INALAS/INGAAS METAMORPHIC HIGH ELECTRON MOBILITY TRANSISTOR

BACKGROUND OF THE INVENTION

1. Field of the Invention

This invention relates to a method of sulfuration treatment for an InAlAs/InGaAs metamorphic high electron mobility transistor (MHEMT) and particularly to the method of making the InAlAs/InGaAs MHEMT provided lower gate leakage current, higher drain current density and wider input power swing range.

2. Description of Related Art

It is being widely known that InAlAs/InGaAs Metamorphic High Electron Mobility Transistor (MHEMT) on GaAs substrates, since an indium phosphide (InP) substrate may be replaced with the GaAs substrate, of which the cost is lower and the size may be at most 6 inches, is not fragile.

Moreover, in the InAlAs/InGaAs MHEMT, an $In_xAl_{1-x}As$ buffer layer lies between the GaAs substrate and a channel layer. If the $In_xAl_{1-x}As$ buffer layer is required to bear the stress caused by the no match of a lattice constant of the $In_xAl_{1-x}As$ buffer layer, the stress must not influence the channel layer as possible as it can. The $In_xAl_{1-x}As$ buffer layer may more flexibly adjust the content of indium (In), thereby the best channel layer being achieved.

However, the gate leakage current of the InAlAs/InGaAs MHEMT is higher than that of conventional GaAs pseudomorphic HEMT due to their high indium(In) mole fraction in the channel and Schottky layers of the InAlAs/InGaAs MHEMT. As shown in FIG. 1 illustrating an $In_{0.5}Al_{0.5}As/In_{0.5}Ga_{0.5}As$ hetero-interface of a differential energy gap $\Delta E$ is 0.52 eV, so high Al mole fraction of an undoped $In_{0.5}Al_{0.5}As$ schottky layer generate more surface states; the surface states influenced the donor injection efficiency from an upper δ-doped layer into two dimensional electron gas (2-DEG) of the undoped $In_{0.5}Ga_{0.5}As$ channel layer.

It is known that the gate leakage current of the InAlAs/InGaAs MHEMT is higher, so more the surface states influenced the donor injection efficiency.

Consequently, because of the technical defects of described above, the applicant keeps on carving unflaggingly through wholehearted experience and research to develop the present invention, which can effectively improve the defects described above.

SUMMARY OF THE INVENTION

In order to improve the gate leakage current of the InAlAs/InGaAs MHEMT and the surface states influenced the donor injection efficiency, it is proposed that $(NH_4)_2S_y$ solution and UV-light illumination are used in sulfuration treatment to solve the InAlAs/InGaAs MHEMTs the surface states, the gate leakage current, and further promote DC and RF characteristics.

After the $(NH_4)_2S_y$ solution, originating from the development of III-V Compound Semiconductors of GaAs is used, the effects are achieved as follows:

(1) the intensity of Photoluminescence (PL) increases;
(2) oxygen atom on the surface is removed; and \
(3) a GaAs surface defect may be filled with a sulfur atom so that GaS and $As_2S_3$ bonds may be formed to reduce a surface dangling bond and lower surface states.

Thus, it is known that the $(NH_4)_2S_y$ solution is used to remove the compounds on the surface film, in which the sulfur (S) atom may repair the surface dangling bond and fill up the film vacancy to lower the surface states.

DETAILED DESCRIPTION OF THE PREFERRED EMBODIMENTS

Now, the present invention will be described more specifically with reference to the following embodiments. It is to be noted that the following descriptions of preferred embodiments of this invention are presented herein for purpose of illustration and description only; it is not intended to be exhaustive or to be limited to the precise form disclosed.

This invention relates to a method of sulfuration treatment for InAlAs/InGaAs MHEMT, which is used in a manufacturing process of the InAlAs/InGaAs MHEMT.

Figure 1:
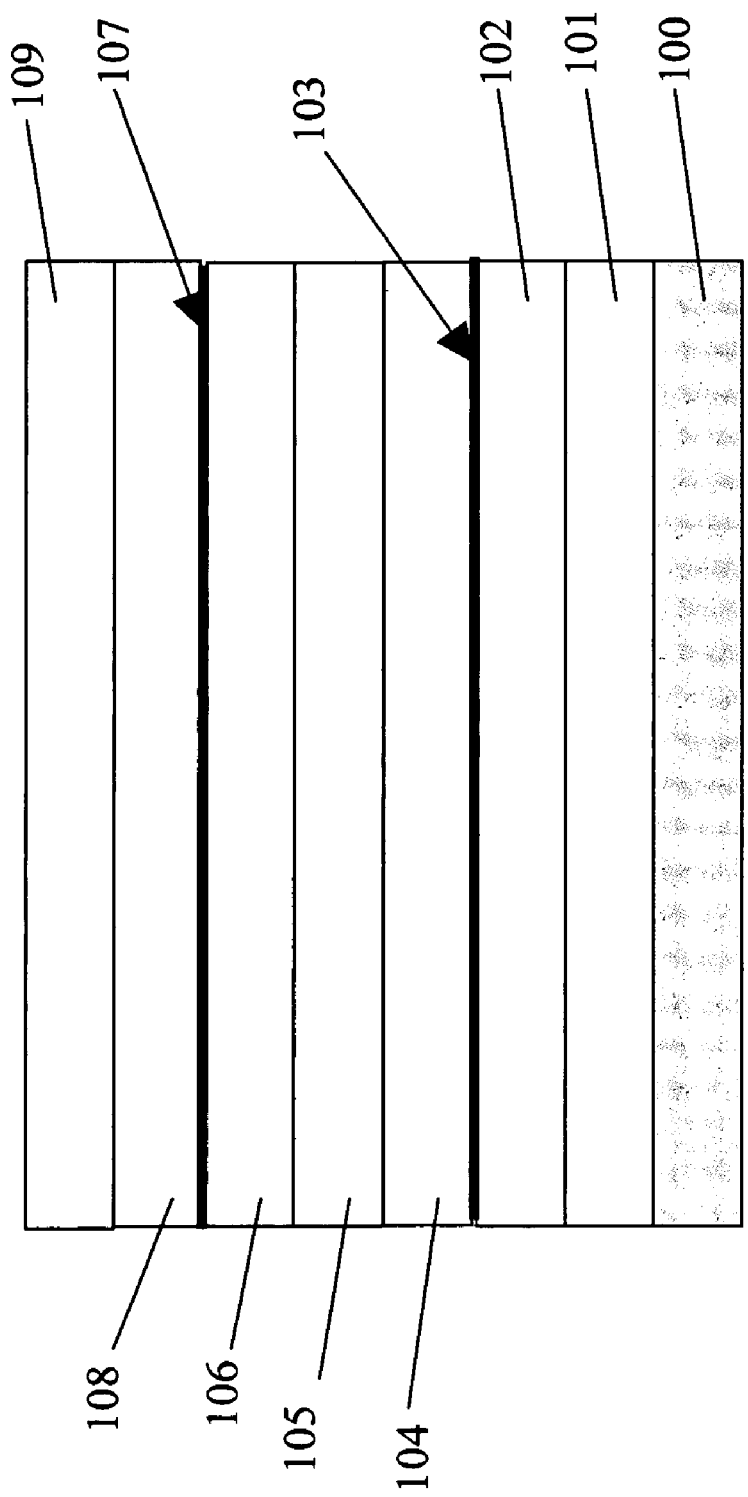
FIG. 1 is a view of a metamorphic InAlAs/InGaAs epitaxy wafer structure on a GaAs substrate.

With reference to FIG. 1 illustrating a metamorphic InAlAs/InGaAs epitaxy wafer structure is formed on a GaAs substrate 100 in the manner of Molecular Beam Epitaxy (MBE). Linearly graded formed 1 um thickness is applied for an $In_xAl_{1-x}As$ buffer layer 101 formed on the GaAs substrate 100, in which the content x of Indium (In) ranges from 1% to 50%.

The $In_xAl_{1-x}As$ buffer layer 101, on which an undoped $In_{0.5}Al_{0.5}As$ buffer layer 102 is 3000 Å in thickness, a lower silicon δ-doped layer 103, a lower undoped $In_{0.5}Al_{0.5}As$ spacer layer 104 is 50 Å in thickness, an undoped $In_{0.5}Ga_{0.5}As$ channel Layer 105 is 110 Å in thickness, an upper undoped $In_{0.5}Al_{0.5}As$ spacer layer 106 is 50 Å in thickness, an upper silicon δ-doped layer 107, an undoped $In_{0.5}Al_{0.5}As$ schottky layer 108 is 150 Å in thickness, and a n+ doped $In_{0.52}Ga_{0.48}As$ cap layer 109 are formed in order.

Figure 2:
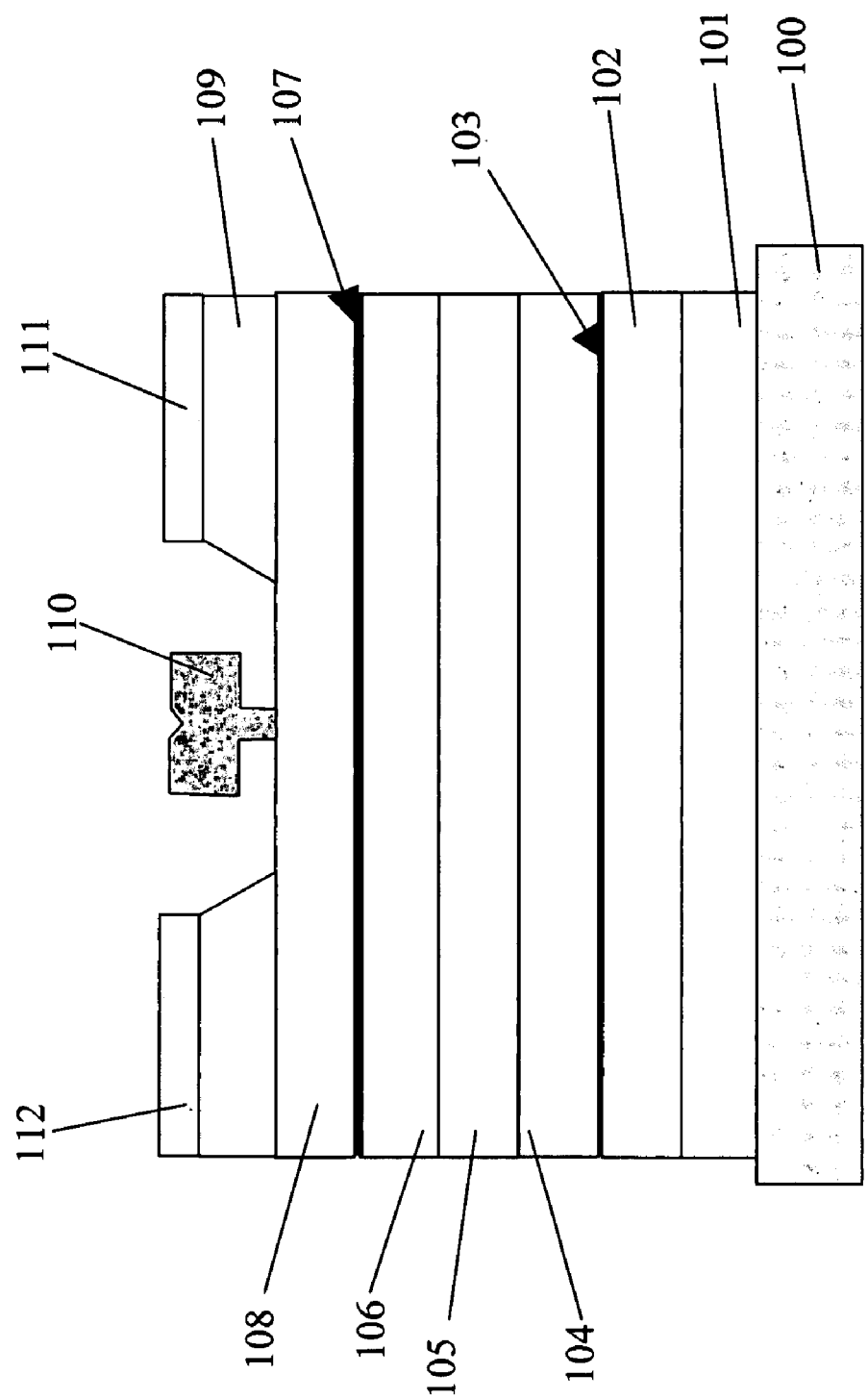
FIG. 2 is a view of the structure of an InAlAs/InGaAs metamorphic high electron mobility transistor(MHEMT)

Moreover, the structure of the InAlAs/InGaAs MHEMT, as shown in FIG. 2, comprises the Gate 110 arranged on the undoped $In_{0.5}Al_{0.5}As$ schottky layer 108 and the Source 112 and the Drain 111 both of which are arranged the n+ doped $In_{0.52}Ga_{0.48}As$ cap layer 109 are at two sides of the Gate 110. Two two-dimensional electron gas (2-DEG) of the structure of InAlAs/InGaAs MHEMT lie in quantum well formed with the undoped $In_{0.5}Ga_{0.5}As$ channel layer 105. Electrons are generated from the upper silicon δ-doped layer 107 and the lower silicon δ-doped layer 103, and separately pass through the upper undoped $In_{0.5}Al_{0.5}As$ spacer layer 106 and the lower undoped $In_{0.5}Al_{0.5}As$ spacer layer 104 to the undoped $In_{0.5}Ga_{0.5}As$ channel layer 105. The undoped $In_{0.5}Al_{0.5}As$ schottky layer 108 is provided on the upper silicon δ-doped layer 107 to improve a schottky barrier height, and the n+doped $In_{0.52}Ga_{0.48}As$ cap layer 109 is provided to improve specific ohm-contact resistance.

The Gate is made from titanium, gold, nickel, palladium, platinum, or the compounds as a conductive material.

The Source is made from titanium, gold, nickel, palladium, platinum, or the compounds as a conductive material.

The Drain is made from titanium, gold, nickel, palladium, platinum, or the compounds as a conductive material.

In the sulfuration treatment according to this invention, the InAlAs/InGaAs MHEMT is soaked in the $(NH_4)_2S_y$ solution and then rinsed with de-ionized water. After being rinsed and blown dry, it is further irradiated with UV rays for two minutes, in which the irradiation of UV rays is to repair the undoped $In_{0.5}Al_{0.5}As$ schottky layer 108 to reduce the surface dangling bond caused by aluminum (Al) and lower the surface states and the gate leakage current.

In comparison, if not being formed in the sulfuration treatment, then $SiN_x$ is formed in a passivation treatment, a dielectric layer is 1500 Å in thickness that is formed on the InAlAs/InGaAs MHEMT is expressed with MHEMT w/o $(NH_4)_2S_y$ treatment. The InAlAs/InGaAs MHEMT that is formed with the sulfuration treatment is expressed with MHEMT w/i $(NH_4)_2S_y$ treatment, in which the length of Gate is 0.2 um and Drain and Source are separated by 3 um.

Under the condition of room temperature of 77K, of the InAlAs/InGaAs MHEMT that is formed with the sulfuration treatment, the surface current density is $8.46 \times 10^{12}$ cm$^{-2}$ and the Hall mobility is 4300 cm$^2$/V–s, of the InAlAs/InGaAs MHEMT that is formed without the sulfuration treatment, the surface current density is $7.53 \times 10^{12}$ cm$^{-2}$ and the Hall mobility is 5030 cm$^2$/V–s. The carrier injection efficiency from the upper silicon-doped layer 107 to the undoped $In_{0.5}Ga_{0.5}As$ channel layer 105 is enhanced without surface trapping effect.

Figure 3:
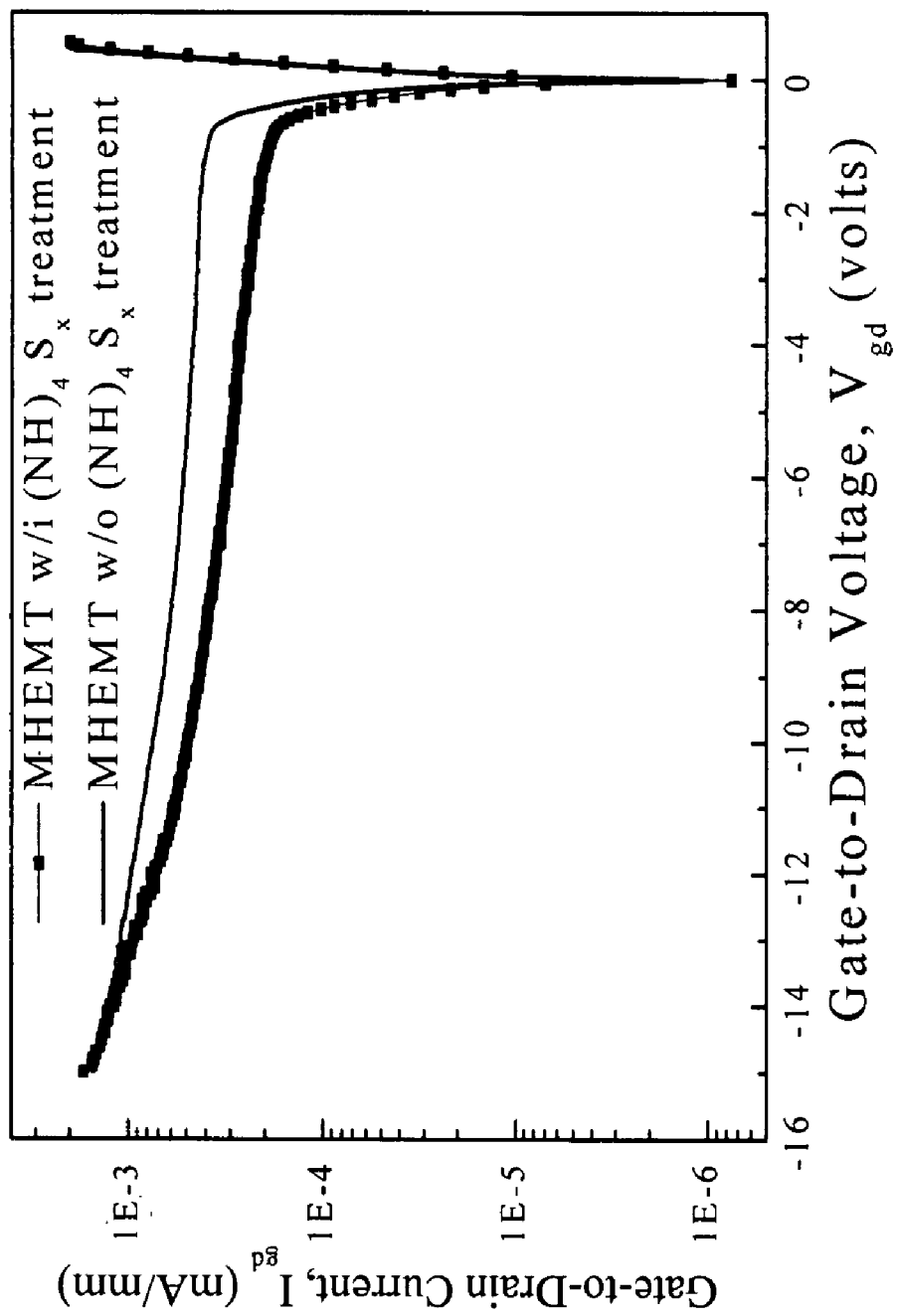
FIG. 3 is a view of Gate-to-Drain voltage V.S. Gate-to-Drain current.

As shown in FIG. 3, if 1 mA/mm is the standard for the initial voltage and breakdown voltage of the MHEMT, the gate turn-on voltage of the InAlAs/InGaAs MHEMT without the sulfuration treatment is 0.41V and the breakdown voltage of the InAlAs/InGaAs MHEMT without the sulfuration treatment is –12.3V. The gate turn-on voltage of the InAlAs/InGaAs MHEMT with sulfuration treatment is 0.52V and the breakdown voltage is –13.1V. The increasing of breakdown voltage of the InAlAs/InGaAs MHEMT with sulfuration treatment that reduce the power consumption in the conduction of input of the high frequency and high power.

Figure 4:
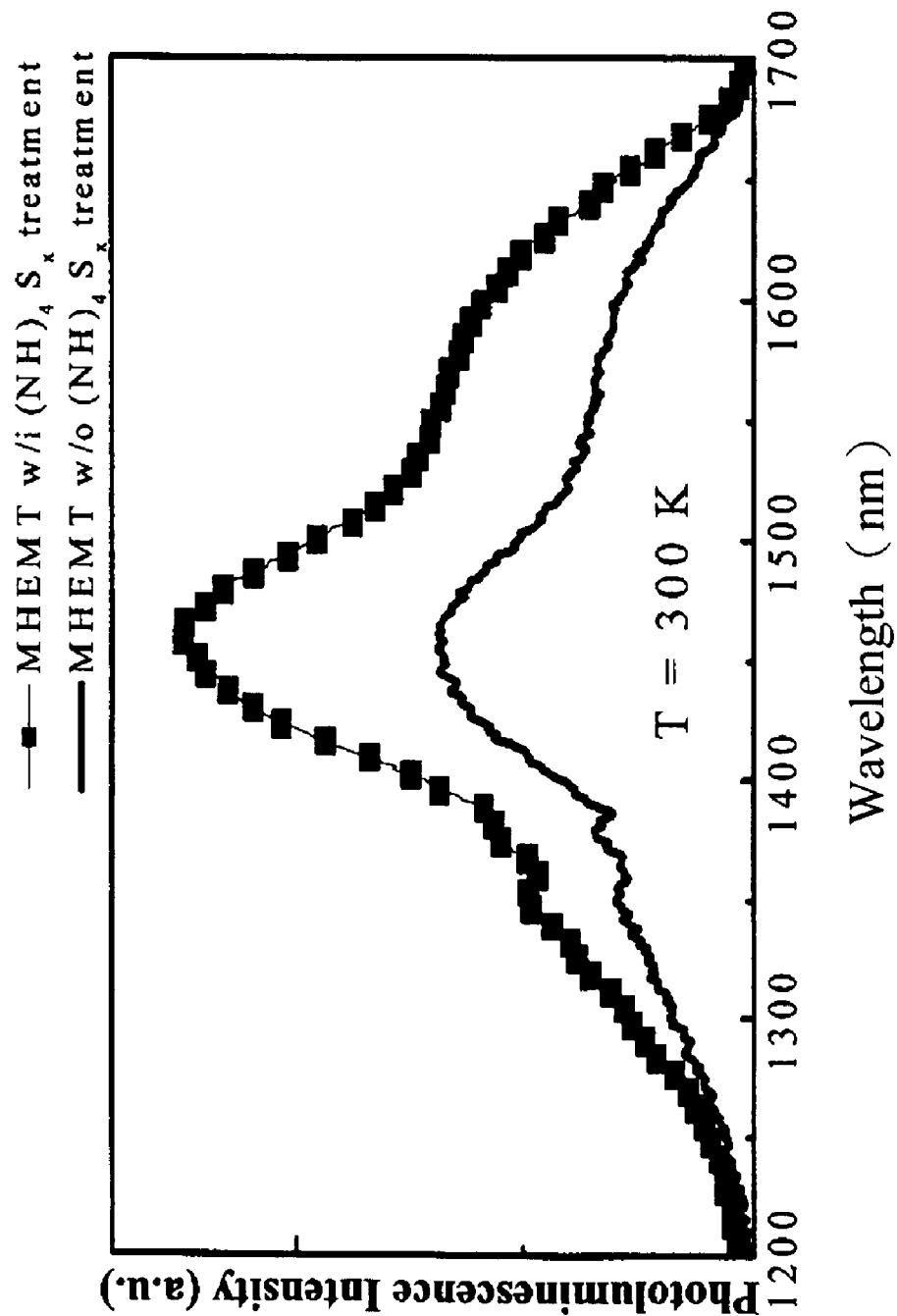
FIG. 4 is a view of Photoluminescence Intensity V.S. Incident Beam Wavelength.

As shown in FIG. 4, Photoluminescence (PL) of the InAlAs/InGaAs MHEMT with sulfuration treatment increases more obviously than that of the InAlAs/InGaAs MHEMT without sulfuration treatment.

Figure 5:
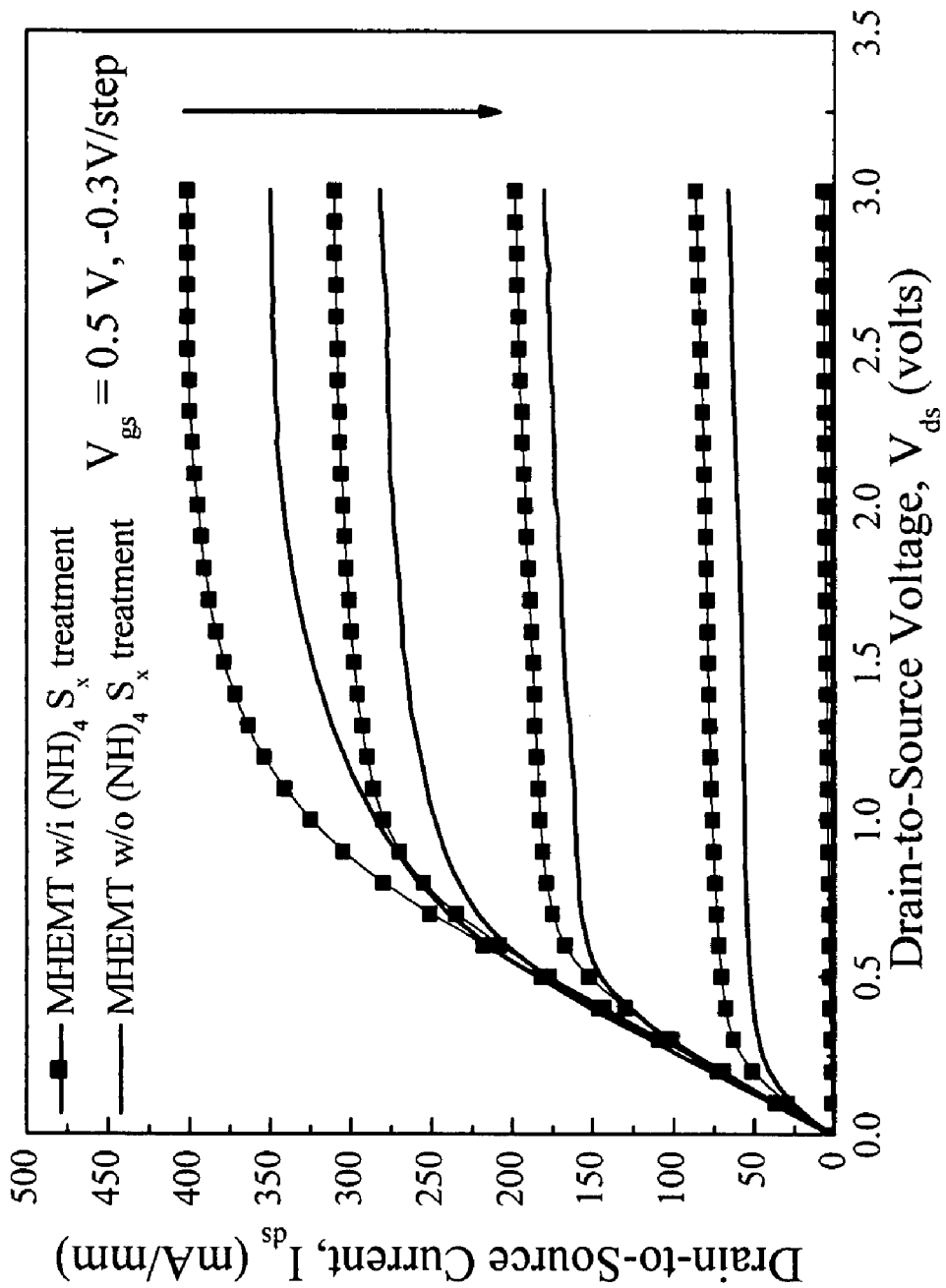
FIG. 5 is an I-V graph of InAlAs/InGaAs MHEMT with sulfuration treatment V.S. that without sulfuration treatment.

As shown in FIG. 5, the Drain-to-Source current ($I_{ds}$) of the InAlAs/InGaAs MHEMT with sulfuration treatment increases more obviously.

Figure 6:
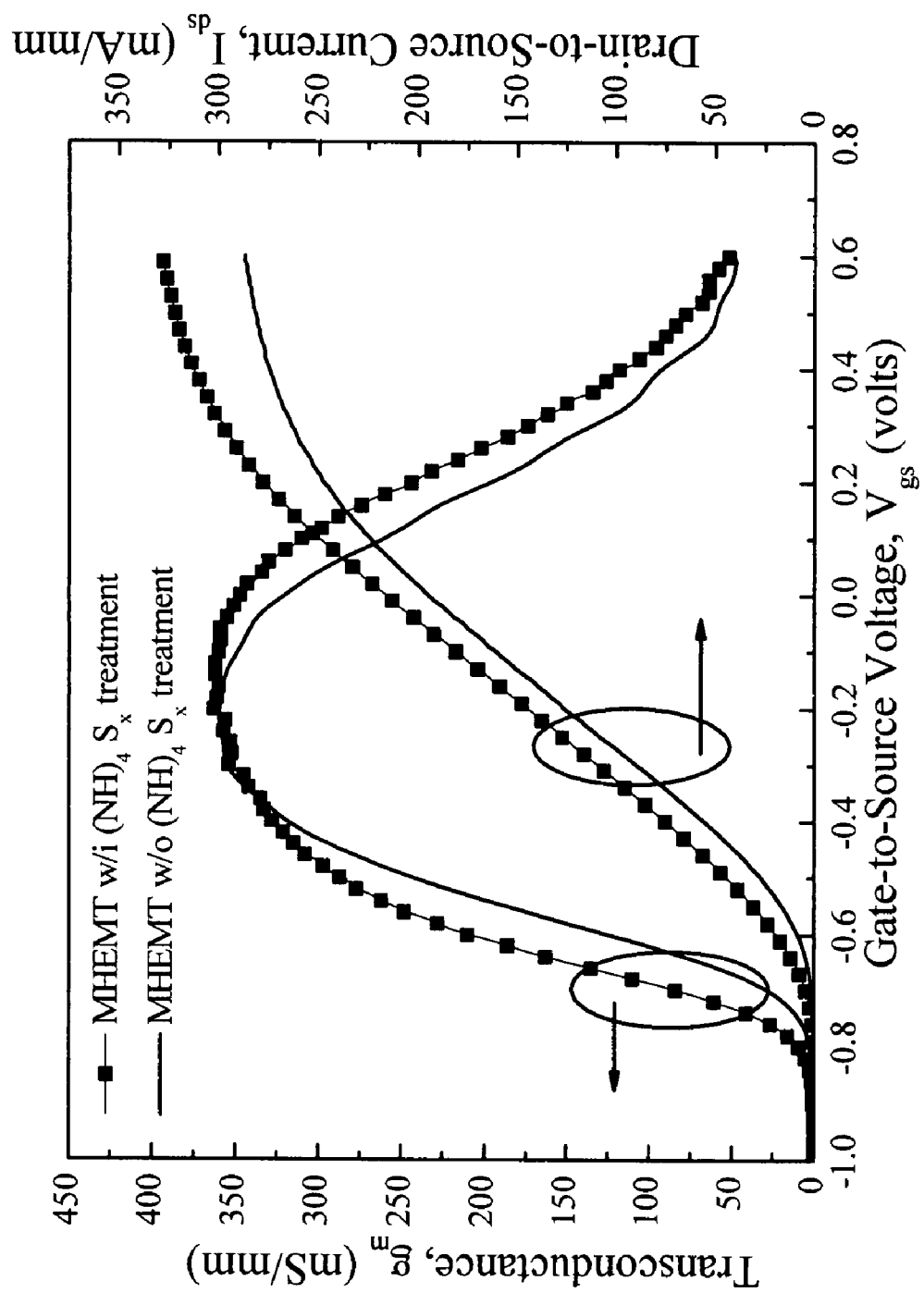
FIG. 6 is an graph of Transconductance (gm) and Drain-to-Source for the InAlAs/InGaAs MHEMT with sulfuration treatment V.S. that without sulfuration treatment.

As shown in FIG. 6, when in the Drain-to-Source voltage is fixed, and the Gate-to-Source voltage ($V_{gs}$) is different; it is known that the maximum transconductance (gm) of the InAlAs/InGaAs MHEMT with sulfuration treatment increases to 360 mS/mm, the maximum Drain-to-Source current ($I_{ds}$) increases to 330 mA/mm, and the linear input range of Gate-to-Source voltage $V_{gs}$ also increases. With small-signal analysis, the maximum current cutoff frequency ($f_t$) also increases, the maximum oscillation frequency ($f_{max}$) increases with increasing Drain-to-Source resistance ($R_{ds}$), and noise figure decreases.

What described above occurs because the InAlAs/InGaAs MHEMT with sulfuration treatment reduces the possibility of non-radiation recombination caused by the surface states after the undoped $In_{0.5}Al_{0.5}As$ schottky layer 108 is formed with sulfuration treatment.

In this invention, with sulfuration treatment, the InAlAs/InGaAs MHEMT is soaked in the $(NH_4)_2S_y$ solution and further irradiated with UV rays to repair the surface dangling bond or fill up the film vacancy, lower the surface states, the Gate leakage current, and the noise figure, increase the initial voltage, the breakdown voltage range, the PL, the Drain-to-Source current, the tranductance (gm), the maximum current cutoff frequency ($f_t$), and the maximum oscillation frequency ($f_{max}$).

The structured epitaxy wafer serves as a substrate of GaAs, on which the epitaxy layer is made from InAlAs/InGaAs of material; however, the content of indium (In) in each layer is different depending on a supplier and its source, and the structure of epitaxy layer may also be changed with a design by the supplier. Further, the content x of indium (In) in the buffer layer ranges from 1% up to 70%.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of sulfuration treatment for a InAlAs/InGaAs metamorphic high electron mobility transistor (MHEMT), in which the InAlAs/InGaAs metamorphic high electron mobility transistor (MHEMT) is soaked in the $(NH_4)_2S_y$ solution, rinsed with deionized water, blown dry, and then irradiated with UV rays; wherein an epitaxy wafer selected for manufacturing of the InAlAs/InGaAs MHEMT is a substrate of GaAs, in which the InAlAs/InGaAs epitaxy wafer is formed in the manner of Molecular Beam Epitaxy (MBE), and the content x of indium(In) in the $In_xAl_{1-x}As$ buffer layer of epitaxy(epi) wafer ranges from 1% up to 70%.

2. The method of sulfuration treatment for the InAlAs/InGaAs MHEMT according to claim 1, wherein the epitaxy structure comprises a GaAs substrate on which an $In_xAl_{1-x}As$ buffer layer is formed, of which the content x of indium(In) ranges from 1% to 50%, and an undoped $In_{0.5}Al_{0.5}As$ buffer layer, a lower silicon δ-doped layer, a lower undoped $In_{0.5}Al_{0.5}As$ spacer layer, an undoped $In_{0.5}Ga_{0.5}As$ channel Layer, an upper undoped $In_{0.5}Al_{0.5}As$ spacer layer, an upper silicon δ-doped layer, an undoped In0.5Al0.5As schottky layer, and a n+ doped $In_{0.52}Ga_{0.48}As$ cap layer.

3. The method of sulfuration treatment for the InAlAs/InGaAs MHEMT according to claim 2, wherein the InAlAs/InGaAs MHEMT comprises:
   Gate provided on the undoped $In_{0.5}Al_{0.5}As$ schottky layer;
   Source and Drain that are provided at two sides of Gate and arranged on the n+ doped $In_{0.52}Ga_{0.48}As$ cap layer.

4. The method of sulfuration treatment for the InAlAs/InGaAs MHEMT according to claim 3, wherein the Gate is made from titanium, gold, nickel, palladium, platinum, or the compounds as a conductive material.

5. The method of sulfuration treatment for the InAlAs/InGaAs MHEMT according to claim 3, wherein the Source is made from titanium, gold, nickel, palladium, platinum, or the compounds as a conductive material.

6. The method of sulfuration treatment for the InAlAs/InGaAs MHEMT according to claim 3, wherein the Drain is made from titanium, gold, nickel, palladium, platinum, or the compounds as a conductive material.

* * * * *